(12) United States Patent
Tanobe et al.

(10) Patent No.: US 12,407,074 B2
(45) Date of Patent: Sep. 2, 2025

(54) HIGH-FREQUENCY LINE STRUCTURE, SUBASSEMBLY, LINE CARD, AND METHOD FOR MANUFACTURING LINE STRUCTURE

(71) Applicant: Nippon Telegraph and Telephone Corporation, Tokyo (JP)

(72) Inventors: Hiromasa Tanobe, Tokyo (JP); Josuke Ozaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 512 days.

(21) Appl. No.: 17/775,517

(22) PCT Filed: Nov. 13, 2019

(86) PCT No.: PCT/JP2019/044530
§ 371 (c)(1),
(2) Date: May 9, 2022

(87) PCT Pub. No.: WO2021/095163
PCT Pub. Date: May 20, 2021

(65) Prior Publication Data
US 2022/0399624 A1 Dec. 15, 2022

(51) Int. Cl.
*H01P 1/04* (2006.01)
*H01L 23/495* (2006.01)
(Continued)

(52) U.S. Cl.
CPC ........ *H01P 1/047* (2013.01); *H01L 23/49541* (2013.01); *H01P 3/08* (2013.01);
(Continued)

(58) Field of Classification Search
CPC .. H01P 1/047; H01P 3/08; H01P 5/028; H01P 11/003; H01P 3/081; H01P 3/006; H01P 1/2007; H01P 3/003; H01P 5/08; H01P 3/085; H01P 3/088; H01P 5/02; H01P 3/082; H01L 23/49541; H01L 2223/6616; H01L 2223/6627; H01L 2223/6683;
(Continued)

(56) References Cited

U.S. PATENT DOCUMENTS 5,677,570 A * 10/1997 Kondoh ............ H01L 23/49503
257/691
8,655,119 B2 * 2/2014 Yagisawa ................ H01P 3/003
385/88
9,754,864 B1 * 9/2017 Xue .................. H01L 23/49562

FOREIGN PATENT DOCUMENTS

JP 6122380 B2 4/2017

* cited by examiner

*Primary Examiner* — John W Poos
(74) *Attorney, Agent, or Firm* — Slater Matsil, LLP

(57) ABSTRACT

A high-frequency line structure includes: a high-frequency line substrate; ground lead pins fixed to ground ends provided in a bottom surface of the high-frequency line substrate; and signal lead pins fixed to signal line ends provided in the bottom surface of the high-frequency line substrate, wherein the signal lead pins are arranged between the ground lead pins, the signal lead pins have a structure in which each of the signal lead pins springs up in a direction toward a side on which the high-frequency line substrate is arranged, from a horizontal plane to which bottom surfaces of the ground lead pins pertains, and spring-up heights in the structure in which the respective signal lead pins spring up are substantially the same.

10 Claims, 17 Drawing Sheets

(51) Int. Cl.
  *H01P 3/08*    (2006.01)
  *H01P 5/02*    (2006.01)
  *H05K 1/02*    (2006.01)
  *H05K 1/18*    (2006.01)
(52) U.S. Cl.
  CPC ............ *H01P 5/028* (2013.01); *H05K 1/025* (2013.01); *H05K 1/18* (2013.01)
(58) Field of Classification Search
  CPC . H01L 2224/45144; H01L 2224/48091; H01L 23/367; H01L 23/66; H01L 2924/00; H01L 2924/00014; H01L 2924/13055; H01L 2924/13091; H01L 2924/19107; H01L 2924/3011; H05K 1/025; H05K 1/18
  See application file for complete search history.

HIGH-FREQUENCY LINE STRUCTURE, SUBASSEMBLY, LINE CARD, AND METHOD FOR MANUFACTURING LINE STRUCTURE

CROSS-REFERENCE TO RELATED APPLICATIONS

This application is a national phase entry of PCT Application No. PCT/JP2019/044530, filed on Nov. 13, 2019, which application is hereby incorporated herein by reference.

TECHNICAL FIELD

The present invention relates to a high-frequency line structure, a subassembly, and a line card with excellent high-frequency characteristics, and a method for manufacturing a high-frequency line structure.

BACKGROUND

A plurality of various optoelectronic components are densely mounted on a line card installed in communication devices to achieve desired communication functions. These communication devices are being developed for a wider band for transmission at 1 Tbps, and a wide band that enables transmission at 70 GHz or higher is becoming necessary in some regions of printed boards for each of a plurality of high-frequency lines on the printed boards that serve as substrates for the line card.

However, with the miniaturization of optoelectronic components in recent years, the pitch of the plurality of high-frequency lines that propagate high-frequency signals between optoelectronic components is also becoming smaller and smaller, and this is causing crosstalk problems between adjacent high-frequency lines to become apparent. Crosstalk in such areas where the high-frequency lines and optoelectronic components are connected on the printed board has been an important issue.

PTL 1 discloses a technology for miniaturizing a three-dimensional structure of an optical module in which an optical waveguide, an optoelectronic element, and so on, are mounted on a substrate. FIG. 12 shows a side cross-sectional view of an optical module 1001 described in PTL 1. An optical fiber 1002 is connected to the optical module 1001, and a photodiode (PD) 1003 and a transimpedance amplifier (TIA) 1004 are mounted within a package. A high-frequency signal output from the TIA 1004 propagates to a high-frequency line 1005, which penetrates a base that is made of an insulator, and a lead pin 1006 having the same thickness.

CITATION LIST

Patent Literature

[PTL 1] Japanese Patent No 6122380.

SUMMARY

Technical Problem

However, this optical module does not have a configuration for adjusting impedance matching, and crosstalk cannot be reduced. Consequently, it has been difficult to achieve a wider band that enables high-frequency signals to be stably propagated from DC to 70 GHz.

Means for Solving the Problem

To solve the foregoing problem, a high-frequency line structure according to the embodiments of present invention includes: a high-frequency line substrate; ground lead pins fixed to ground ends provided in a bottom surface of the high-frequency line substrate; and signal lead pins fixed to signal line ends provided in the bottom surface of the high-frequency line substrate, wherein the signal lead pins are arranged between the ground lead pins, the signal lead pins have a structure in which each of the signal lead pins springs up in a direction toward a side on which the high-frequency line substrate is arranged, from a horizontal plane to which bottom surfaces of the ground lead pins pertains, and spring-up heights in the structure in which the respective signal lead pins spring up are substantially the same.

A method for manufacturing a high-frequency line structure according to embodiments of the present invention is a method for manufacturing a high-frequency line structure by mounting, on a base jig, a thick lead frames including a plurality of lines, which are arranged at an interval, base end portions of the lines being integrally connected by a joint portion and formed in a substantial comb shape, a thin lead frame including a plurality of lines, which are arranged at an interval, base end portions of the lines being integrally connected by a joint portion and formed in a substantial comb shape, the thin lead frame having ridge portions in the lines, and a high-frequency line substrate having a transmission line in a bottom surface thereof, the method including steps of: arranging the lines of the thin lead frame between the lines of the thick lead frame above the base jig, and arranging the ridge portions of the thin lead frame so as to come into contact with a top surface of the base jig; bringing ground ends provided in the bottom surface of the high-frequency line substrate and leading end portions of the lines of the thick lead frame into contact with each other; bringing signal line ends provided in the bottom surface of the high-frequency line substrate and leading end portions of the lines of the thin lead frame into contact with each other; pressing a top surface of a positioning pressure jig placed on a top surface of a joint portion of the thick lead frame and a top surface of a joint portion of the thin lead frame, and a top surface of the high-frequency line substrate; fixing, using a conductive material, and electrically connecting portions at which the ground ends provided in the bottom surface of the high-frequency line substrate and the leading end portions of the lines of the thick lead frame are brought into contact with each other, and portions at which the signal line ends provided in the bottom surface of the high-frequency line substrate and the leading end portions of the lines of the thin lead frames are brought into contact with each other; and cutting the thick lead frame and the thin lead frame.

Effects of Embodiments of the Invention

According to embodiments of the present invention, it is possible to provide a method for manufacturing a high-frequency line structure that enables highly accurate positioning when high-frequency lines are electrically connected to mount constituent components, to provide a high-frequency line structure, a subassembly, and a line card with high-frequency characteristics that enable a reduction in crosstalk over a wide band, and to provide an electronic component and an optical module component that have wide-band characteristics for next-generation 1 Tbps and beyond.

BRIEF DESCRIPTION OF THE DRAWINGS

FIG. 6A is a side perspective view of the subassembly according to the first embodiment of the present invention.

DETAILED DESCRIPTION OF ILLUSTRATIVE EMBODIMENTS

First Embodiment

The first embodiment of the present invention will be described with reference to the drawings. A method for manufacturing a high-frequency line structure 10, and the high-frequency line structure 10 according to the first embodiment of the present invention will be described with reference to FIGS. 1A to 4.

<Method for Manufacturing High-frequency Line Structure>

Figure 1A:
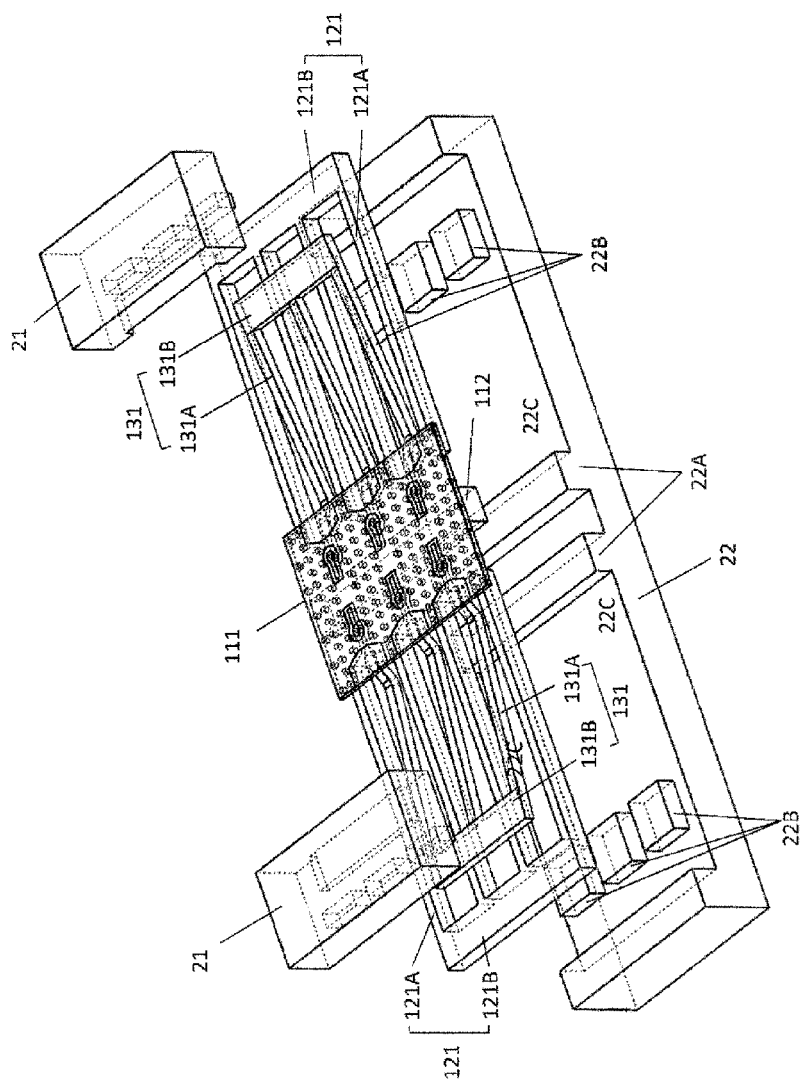
FIG. 1A is a bird's eye perspective view that shows a step of arranging constituent components in a method for manufacturing a high-frequency line structure according to a first embodiment of the present invention.
Figure 1B:
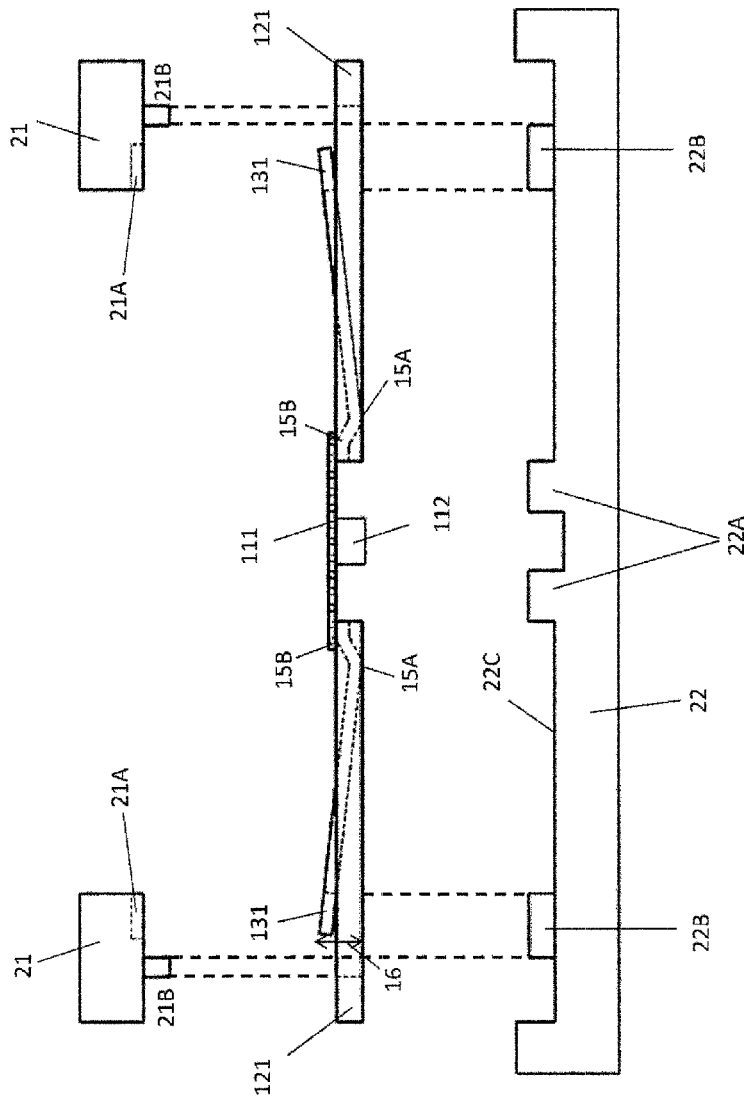
FIG. 1B is a side perspective view that shows the step of arranging the constituent components in the method for manufacturing a high-frequency line structure according to the first embodiment of the present invention.

FIG. 1A is a bird's eye perspective view that shows an arrangement of constituent components in a method for manufacturing a high-frequency line structure according to the first embodiment of the present invention, and FIG. 1B is a side perspective view. A high-frequency line substrate 111 according to the present embodiment is constituted by two metal layers, and the bottom and top surfaces each have coplanar lines (size: about 10 mm×10 mm). Thick lead frames 121, which come into contact with ground ends of the coplanar lines provided in the bottom surface of the high-frequency line substrate 111, and thin lead frames 131, which come into contact with signal line ends of the coplanar lines, are prepared. A heat sink 112 is provided in the bottom surface of the high-frequency line substrate 111. These constituent components are arranged on a base jig 22, and the constituent components are aligned by positioning pressure jigs 21.

Each thick lead frame 121 (thickness: 0.3 mm) includes a plurality of lines 121A (length: 20 mm, width: 0.2 mm), the plurality of lines 121A are arranged at an interval (0.8 mm), and base end portions of the lines 121A are integrally connected by a joint portion 121B and formed in a substantial comb shape.

Each thin lead frame 131 (thickness: 0.2 mm) includes a plurality of lines 131A (length: 20 mm, width: 0.2 mm), the plurality of lines 131A are arranged at an interval (0.8 mm), and base end portions of the lines 131A are integrally connected by a joint portion 131B and formed in a substantial comb shape. In FIG. 1A, each thick lead frame 121 consists of four lines, and each thin lead frame 131 consists of three lines. However, the number of lines is not limited thereto. As will be described later, the substantially comb-shaped lines 131A of the thin lead frames 131 need only be arranged between the substantially comb-shaped lines 121A of the thin lead frames 121.

As shown in FIG. 1B, each thin lead frame 131 has a ridge portion 15A at a position 2.4 mm away from a leading end portion of each line 131A on a surface in contact with a top surface 22C of the base jig 22. The ridge portion 15A extends in a direction perpendicular to the lengthwise direction of each thin lead frame 131. The ridge portion 15A may have a bent shape or a curved shape. The ridge portion 15A need only have a protruding shape so as to come into contact with the top surface 22C of the base jig 22. As a result of thus having the ridge portions 15A, each thin lead frame 131 has a structure in which it springs up, and the height of a base end portion thereof (the height in the vertical direction from a horizontal plane with which the ridge portions 15A are in contact to the top surface of the base end; hereinafter referred to as a "spring-up amount 16") is about 10 mm.

As shown in FIG. 1B, each thin lead frame 131 has a ridge portion 15B on a surface that comes into contact with a transmission line provided in the bottom surface of the high-frequency line substrate 111. The ridge portion 15B extends in a direction perpendicular to the lengthwise direction of the thin lead frame 131. The ridge portion 15B is formed such that a top surface of the leading end portion of each line 131A of the thin lead frame 131 is in the same plane as a top surface of a leading end portion of each line 121A of the thick lead frame 121. Each ridge portion 15B may have a bent shape or a curved shape.

In the present embodiment, Kobar (iron-nickel-cobalt alloy) is used as a material of the thick lead frames 121 and the thin lead frames 131. Here, the thermal expansion coefficient of Kobar is substantially equal to the thermal expansion coefficient of ceramic used in printed boards. Any other alloy of tungsten, iron, Ni, or the like can alternatively be used as the material of the thick lead frames 121 and the thin lead frames 131.

The substantially comb-shaped lines 131A of each thin lead frame 131 are arranged between the substantially comb-shaped lines 121A of the corresponding thick lead frame 121. At this time, the lines 131A of the thin lead frame 131 and the lines 121A of the thick lead frame 121 are arranged so as to not interfere with each other.

The leading end portions of the lines 131A of the thin lead frame 131 and the leading end portions of the lines 121A of the thick lead frame 121 are aligned in the lengthwise direction. In other words, the leading ends of the top surfaces of the lines 131A of the thin lead frame 131 and the leading ends of the top surfaces of the lines 121A of the thick lead frame 121 are arranged on a straight line with which a plane intersects that is perpendicular, in the lengthwise direction, to a horizontal plane to which the top surface of the thick lead frame 121 and the top surface of the leading end portion of the thin lead frame 131 pertain.

The ridge portion 15A of each thin lead frame 131 is arranged so as to come into contact with the top surface 22C of the base jig 22.

The ground end of the transmission line provided in the bottom surface of the high-frequency line substrate 111 is brought into contact with the leading end portions of the lines 121A of the thick lead frames 121. The signal line end of the transmission line provided in the bottom surface of the high-frequency line substrate 111 is brought into contact with the leading end portions of the lines 131A of each thin lead frame 131.

Each positioning pressure jig 21 has, on its bottom surface, a recessed portion 21A to be fitted to the joint portion 131B of the corresponding thin lead frame 131, and protruding portions 21B to be fitted to spaces between the lines 121A of the corresponding thick lead frame 121. The depth of the recessed portion 21A is 0.15 mm, and it is desirable that the depth of the recessed portion 21A is smaller than the thickness of each thin lead frame 131. It is desirable that the width of the recessed portion 21A is about 0.1 mm larger than the width of the joint portion 131B of each thin lead frame 131. The height of each protruding portion 21B is 0.15 mm, and it is desirable that the height of the protruding portion 21B is smaller than the thickness of each thick lead frame 121. It is desirable that the width of each protruding portion 21B is about 0.1 mm smaller than the width of each space between the lines 121A of each thick lead frame 121.

The base jig 22 has, on the top surface 22C, protruding portions 22B to be fitted to spaces between the lines 121A of the thick lead frames 121. The height of each protruding portion 22B is 0.15 mm, and it is desirable that the height of the protruding portion 22B is smaller than the thickness of the thick lead frame 121. It is desirable that the width of the protruding portion 22B is about 0.1 mm smaller than the width of the space between the lines 121A of the thick lead frame 121.

The base jig 22 also have protruding portions 22A on the top surface 22C, and the height of each protruding portion 22A is 0.25 mm. It is desirable that the height of the protruding portions 22A is smaller than the thickness of the thick lead frame 121. The depth of the groove between the protruding portions 22A need only be a depth at which the heat sink 112 fits.

Figure 2A:
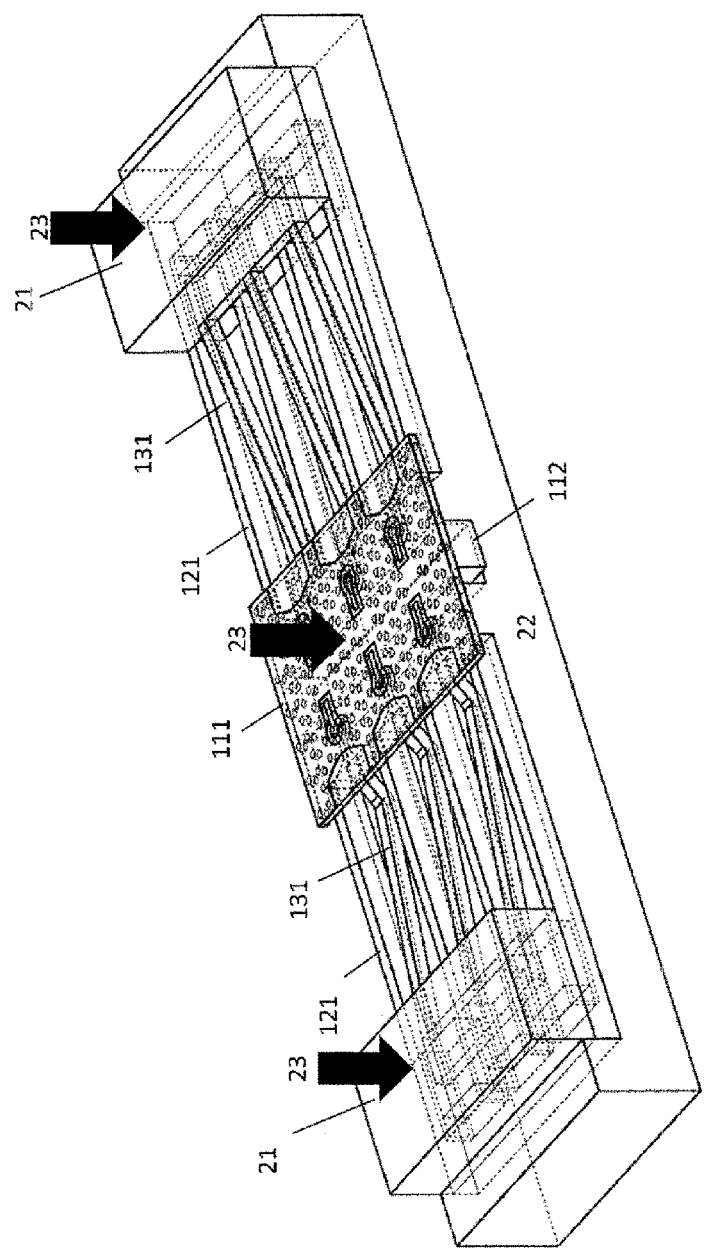
FIG. 2A is a bird's eye perspective view that shows a step of pressing the constituent components in the method for manufacturing a high-frequency line structure according to the first embodiment of the present invention.
Figure 2B:
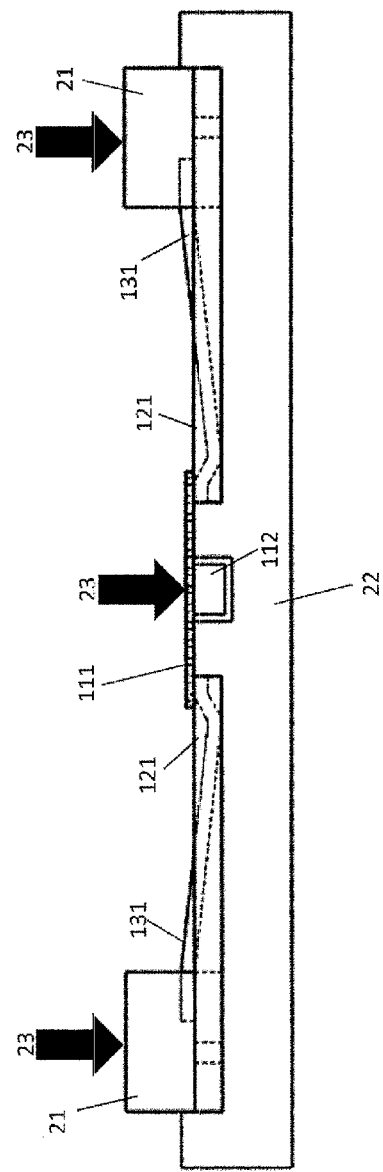
FIG. 2B is a side perspective view that shows the step of pressing the constituent components in the method for manufacturing a high-frequency line structure according to the first embodiment of the present invention.

FIGS. 2A and 2B show a state where the constituent components are pressed. After all the constituent components have been arranged and aligned on the base jig 22, the top surfaces of the positioning pressure jigs 21 and the top surface of the high-frequency line substrate 111 are pressed. The pressing direction is indicated by arrows 23 in FIGS. 2A and 2B.

Due to deforming due to springness in the lead lengthwise direction thereof, the thin lead frames 131 are fitted by the base jig 22 and the positioning pressure jigs 21, and thus, firm fitting is achieved, rattling is suppressed, and the constituent components are integrated. In detail, when the positioning pressure jigs 21 and the high-frequency line substrate 111 are pressed, the thin lead frames 131 have elasticity, and a reaction force is generated in the upward direction against the high-frequency line substrate 111 with the ridge portions 15A in contact with the top surface 22C of the base jig 22 as a fulcrum. Thus, the adhesion between the thick lead frames 121, the thin lead frames 131, and the high-frequency line substrate 111 is improved.

Further, the recessed portions 21A of the bottom surfaces of the positioning pressure jigs 21 fit to the joint portions 131B of the thin lead frames 131, the protruding portions 21B fit to the spaces between the lines 121A of the thick lead frames 121, and the protruding portions 22B of the base jig 22 fit to the spaces between the lines 121A of the thick lead frames 121. As a result, it is possible to minimize gaps at portions at which the positioning pressure jigs 21, the thin lead frames 131, and the thick lead frames 121 are fitted to each other, achieve firm fitting, and position the constituent components while suppressing rattling.

In this state, the constituent components are accurately fixed with high adhesion and electrically connected by a conductive bonding material (not shown), such as silver solder, gold tin solder, conductive resin, or a conductive adhesive, at portions at which the top surfaces of the leading end portions of the thin lead frames 131 and of the thick lead frames 121 are in contact with a metal surface provided on the bottom surface of the high-frequency line substrate 111.

Figure 3:
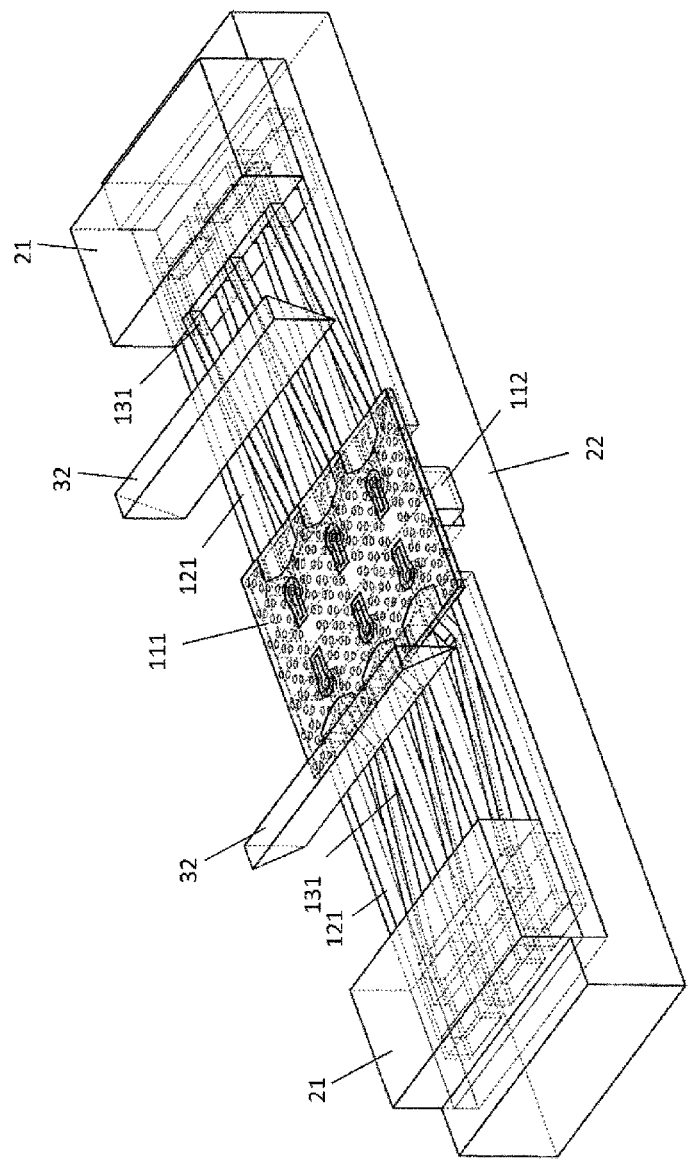
FIG. 3 is a bird's eye perspective view that shows a step of cutting thick lead frames and thin lead frames in the method for manufacturing a high-frequency line structure according to the first embodiment of the present invention.

After being firmly fixed, the lead frames are simultaneously cut at positions about 1 mm to 2 mm away from the high-frequency line substrate 111 by cutting blades 32, as shown in FIG. 3. At this time, the thick lead frames 121, which are arranged below the thin lead frames 131, prevent the lines 131A of the thin lead frames 131 from deforming downward during the cutting.

In the present embodiment, the lead frames are cut at positions about 1 mm to 2 mm away from the high-frequency line substrate 111, but the cutting positions are not limited thereto. However, if the distance from the high-frequency line substrate 111 is 2 mm or longer, the fixation using solder during the aforementioned mounting will become difficult.

<Configuration of High-Frequency Line Structure>

Figure 4A:
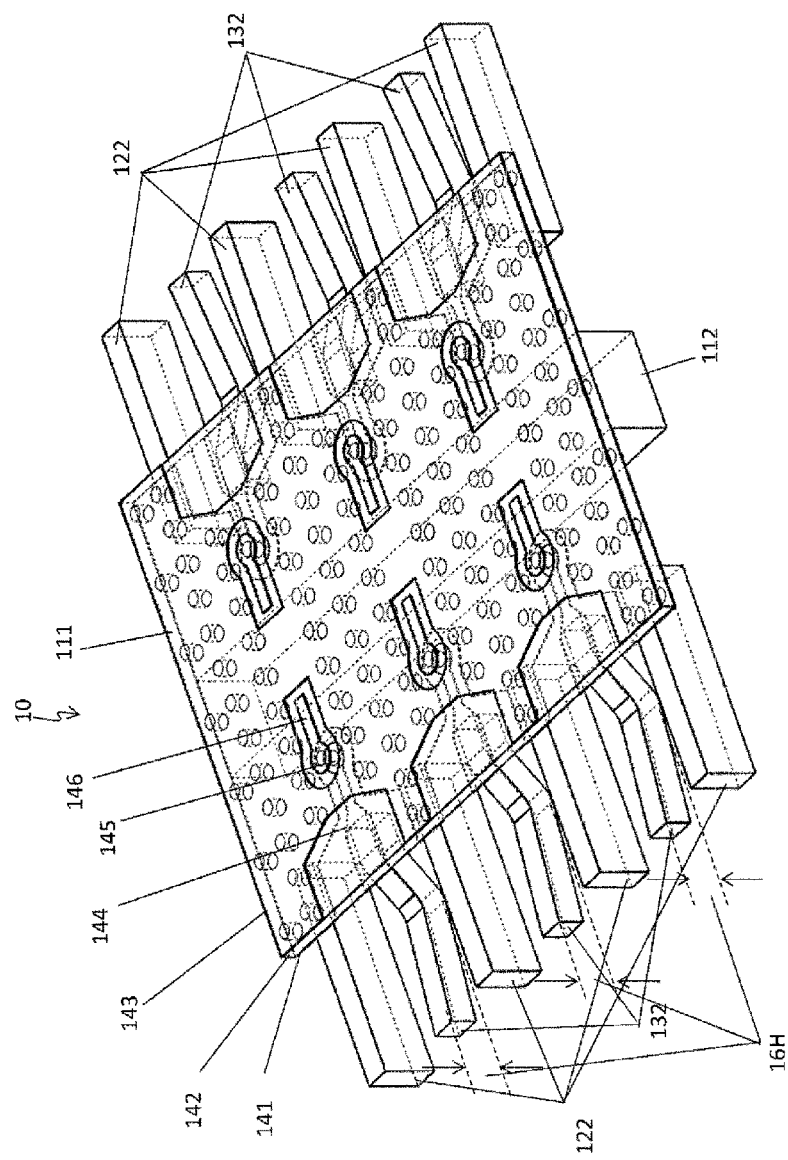
FIG. 4A is a bird's eye perspective view of a high-frequency line structure according to the first embodiment of the present invention.
Figure 4B:
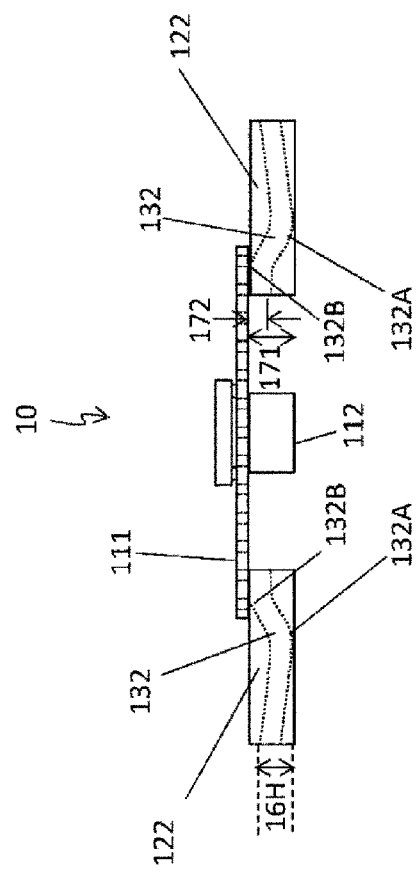
FIG. 4B is a side perspective view of a high-frequency line structure according to the first embodiment of the present invention.

FIG. 4A is a bird's eye perspective view of the high-frequency line structure 10 in a finished state after removed from the base jig 22, and FIG. 4B is a side perspective view. Ground lead pins 122, which are formed from the thick lead frames 121, signal lead pins 132, which are formed from the thin lead frames 131, the high-frequency line substrate 111, and the heat sink 112 are integrated, and the high-frequency line structure 10 has a three-dimensional structure.

The high-frequency line substrate 111 has a metal two-layer structure, has coplanar lines in the bottom and top surfaces, and has a dielectric material 142 therebetween. In the coplanar lines in the bottom surface, opening portions are provided at portions of a bottom ground 141, which is made of metal, and bottom signal lines are provided in these opening portions. In the coplanar lines in the top surface, opening portions are provided at portions of a top ground 143, which is made of metal, and top signal lines are provided in these opening portions. Bottom signal line ends 144 are provided at high-frequency line substrate ends on the bottom side, are connected to the top surface side of the high-frequency line substrate 111 by pseudo coaxial lines 145, and are then connected to top signal line ends 146.

The ground lead pins 122 and the signal lead pins 132 are cut at the same positions during the above-described manufacturing process, and therefore have an equal length, which is about 3 mm. Further, the signal lead pins 132 and the ground lead pins 122 have a structure characterized in that a thickness 171 of each ground lead pin 122 is larger than a thickness 172 of each signal lead pin 132.

Each signal lead pins 132 has a ridge portion 132A, which corresponds to the ridge portion 15A of the thin lead frame 131 in the above-described manufacturing process. Further, each signal lead pins 132 have a structure in which the signal lead pin 132 springs up from a horizontal plane to which the bottom surface of the ground lead pins 122 pertains. A spring-up height 16H in the spring-up structure is the distance between a horizontal plane to which the bottom surface of each ground lead pin 122 pertains and the top surface of a leading end of each signal lead pin 132. The spring-up height 16H is about 0.25 mm to 0.3 mm, and it is desirable that the spring-up height 16H is smaller than or equal to the height of each ground lead pin 122.

Each signal lead pin 132 has a ridge portion 132B at a leading end portion on the side connected to the high-frequency line substrate 111, at a position about 2 mm from the leading end on a surface that comes into contact with the transmission line provided in the bottom surface of the high-frequency line substrate 111. The ridge portion 132B extends in a direction perpendicular to the lengthwise direction of the signal lead pin 132. The ridge portion 132B is formed such that the top surface of the leading end portion of the signal lead pin 132 is in the same plane as the top surface of the leading end portion of each ground lead pin 122. As a result, when the top surfaces of the signal lead pins 132 are connected to the bottom surfaces of the signal line ends of the coplanar lines by a conductive bonding material such as solder, the connection becomes easier and stronger. Each ridge portion 132B may have a bent shape or a curved shape.

As shown in FIG. 4B, each signal lead pins 132 is characterized in the structure in which the signal lead pin 132 springs up from the horizontal plane to which the bottom surface of the corresponding ground lead pin 122 pertains, and has the spring-up height 16H. The spring-up height 16H is the distance between the horizontal plane to which the bottom surface of the ground lead pin 122 pertains and the top surface of the leading end of the signal lead pin 132. As shown in FIGS. 1B and 2B, the spring-up height 16H depends on the spring-up amount 16 employed in the process of manufacturing the high-frequency line structure 10, and depends on the length (line length) in the lengthwise direction of the thin lead frame 131, and can therefore be sufficiently controlled by adjusting the line length at the time of designing.

Here, in the process of manufacturing the high-frequency line structure 10, the spring-up amount 16 can be unified since the base ends of the lines 131A of each thin lead frame 131 is integrated at the joint portion 131B. As a result, substantially the same spring-up height 16H can be applied to all the signal lead pins 132, and thus, when the signal lead pins 132 are mounted on a printed board, variation in high-frequency characteristics between the signal lead pins can be sufficiently suppressed.

Furthermore, during the aforementioned pressing using the positioning pressure jigs 21, the reaction force against the high-frequency line substrate 111 depends on the spring-up amount 16. Therefore, the adhesiveness between the high-frequency line substrate 111, the thick lead frames 121, and the thin lead frames 131 can be controlled by controlling the spring-up amount 16 through the line length.

<Configuration of Subassembly>

Figure 5:
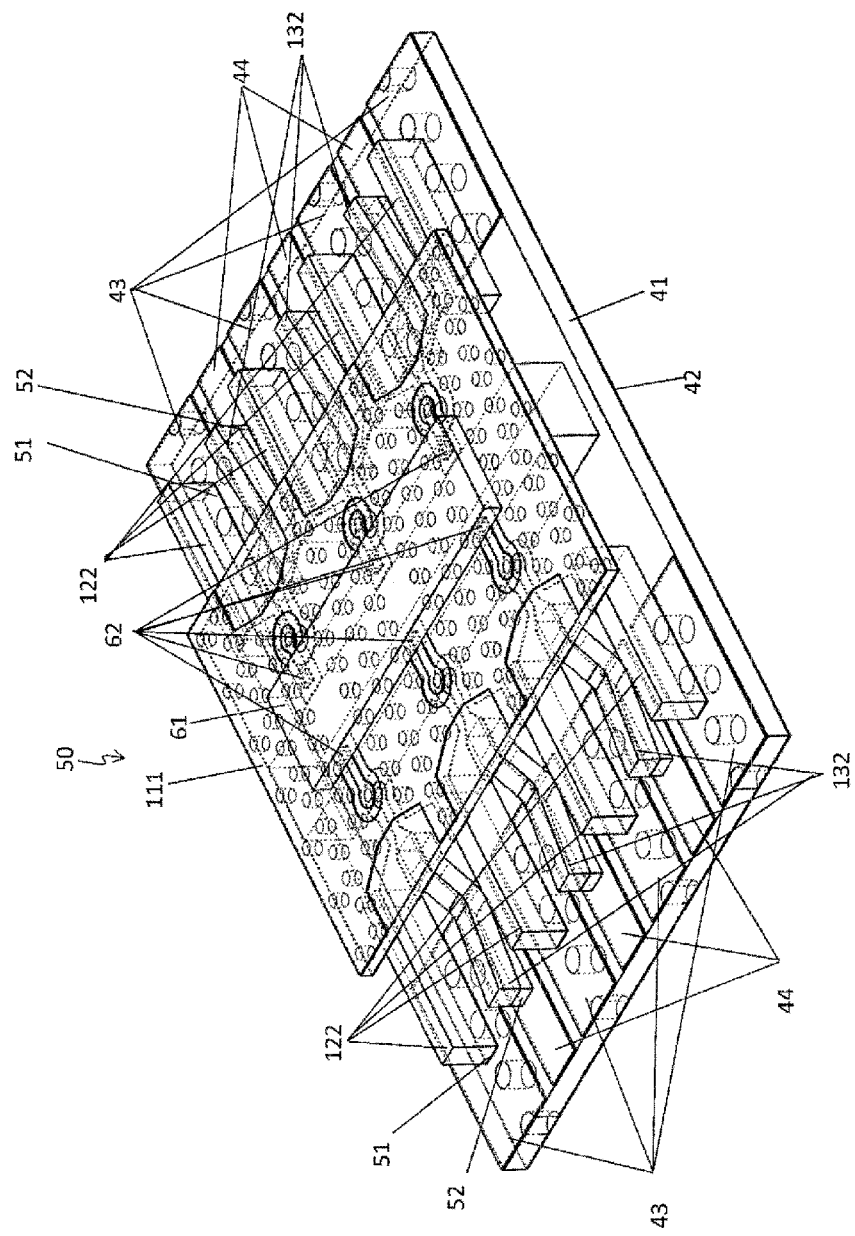
FIG. 5 is a bird's eye perspective view of a subassembly according to the first embodiment of the present invention.

FIG. 5 shows a substrate 5o (hereinafter referred to as a "subassembly") on which the above-described high-frequency line structure 10 is mounted. A printed board 41 has a bottom ground 42 on a bottom surface, and coplanar lines on a top surface. These coplanar lines have top grounds that include top ground ends 43, and signal lines that include signal line ends 44.

The bottom surfaces of the ground lead pins 122 and the top surfaces of the top ground ends 43, and the bottom surfaces of the signal lead pins 132 and the top surfaces of the signal line ends 44 are connected at connecting portions 51 and connecting portions 52, respectively, by an electrically conductive bonding material such as solder. Here, since each signal lead pin 132 has the spring-up height 16H as mentioned above, a predetermined space is provided between the bottom surface of the signal lead pin 132 and the top surface of the corresponding signal line end 44. Thus, mechanical strength can be ensured by the conductive bonding material such as solder, and stable high-frequency characteristics can be provided.

On the top surface of the high-frequency line substrate 111, a wide-band amplifier element 61 is flip-chip mounted between electrodes 62, the ground ends and the signal line ends of the coplanar lines on the top surface of the high-frequency line substrate 111. Note that denotation of a DC terminal, and so on, of the wide-band amplifier element is omitted in the drawings.

Figure 6A:
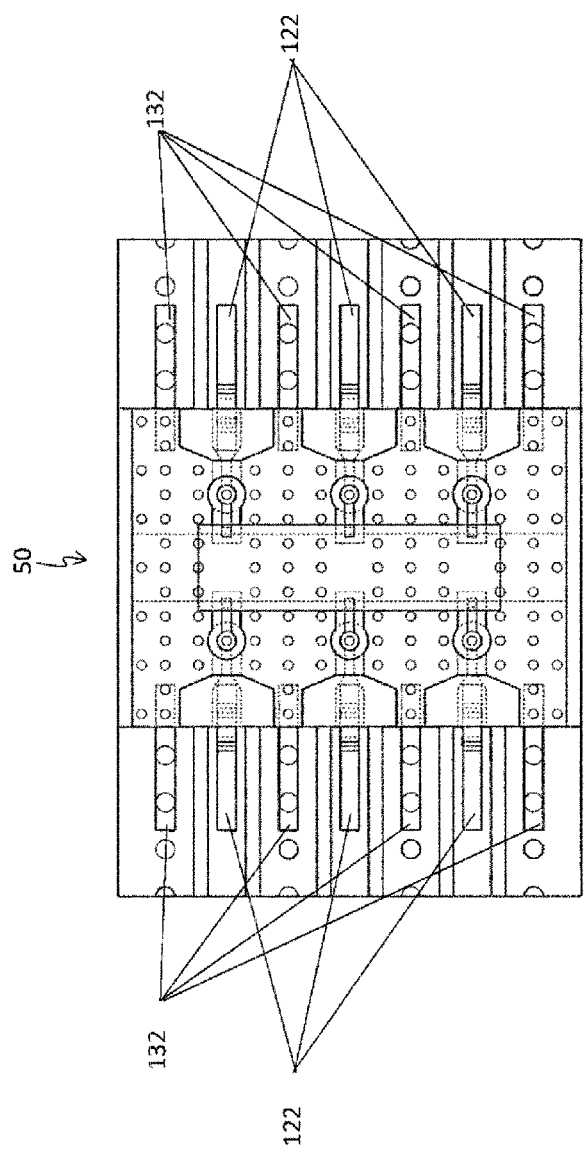
FIG. 6A is a top perspective view of the subassembly according to the first embodiment of the present invention.
Figure 6B:
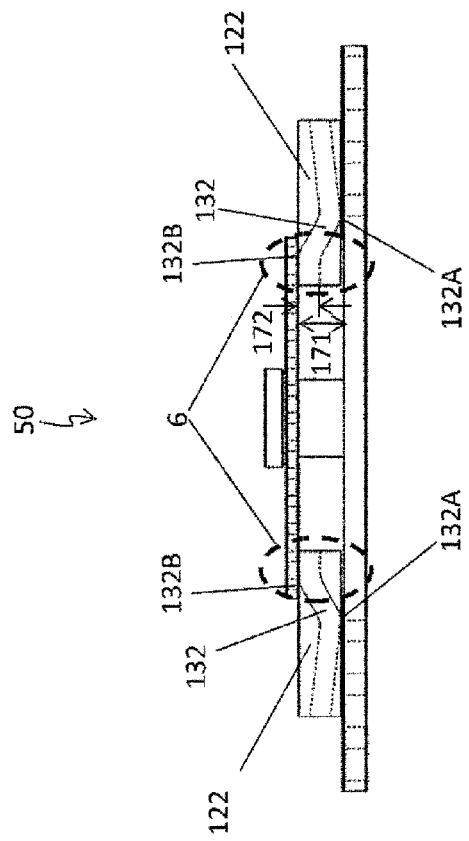

FIG. 6A is a top perspective view of the subassembly 50, and FIG. 6B is a side perspective view. The signal lead pins 132 are arranged between the ground lead pins 122. The ground lead pins 122 and the signal lead pins 132 are electrically connected to the ground ends and the signal line ends, respectively, of the coplanar lines in the bottom surface of the high-frequency line substrate 111. In FIG. 6B, regions 6 (hereinafter referred to as "shielding regions") in which a shielding effect is achieved by the ground lead pins 122 are indicated by dotted lines.

The subassembly 50 according to the present embodiment has a structure characterized in that the thickness 171 of each ground lead pin 122 is larger than the thickness 172 of each signal lead pin 132. When the thickness of the ground lead pin is smaller than or equal to the thickness of the signal lead pin 132, the signal lead pin in principle has a structure in which an electromagnetic field distribution can easily spread, since air is present in the area around the inclined structure portion of the signal lead pin, the impedance in this area becomes high impedance, degrading reflection loss, and at the same time, crosstalk problems due to the large electromagnetic field distribution spread is likely to appear.

In the present embodiment, since the thickness 171 of the ground lead pin 122 is larger than the thickness 172 of the signal lead pin 132, the ground lead pin 122 not only realizes suppression of high impedance due to an increase in capacitance between the ground (earth) and the signal lead pin 132, but also suppresses crosstalk between the signal lead pins 132 by functioning as shield plates for electromagnetic fields. For example, computational simulations confirmed that this configuration is especially effective when the thickness of the ground lead pin 122 is 1.5 times or more the thickness of the signal lead pin 132.

The upper limit of the thickness of the ground lead pin 122 is determined by the balance between the effect of improving crosstalk suppression and the effect of reducing reflection loss. As mentioned above, as the thickness of the ground lead pin 122 increases, the function thereof as a shield plate is further improved and the effect of crosstalk suppression increases. Meanwhile, the increase in capacitance promotes lower impedance, and impedance mismatch occurs in the shielding regions 6 in FIG. 6B. Accordingly, it is desirable that the ground lead pin 122 has a thickness that can suppress crosstalk and can also suppress impedance mismatch.

If the thickness of the thick lead frame 121, which corresponds to the thickness of the ground lead pin 122, becomes thicker than 0.5 mm, burrs may occur at the cutting portions after the cutting in the above-described manufacturing process, and subsequent electrical connection by means of solder or the like may become defective. For this reason, the upper limit of the thickness of the ground lead pin 122 is 0.5 mm.

Figure 7:
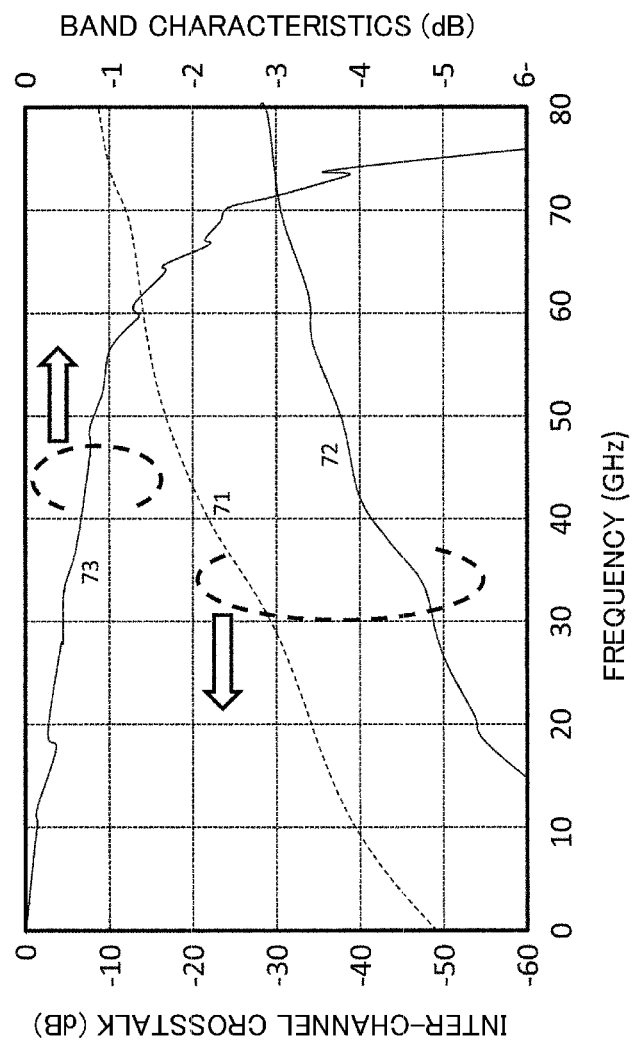
FIG. 7 shows high-frequency characteristics of the subassembly that are obtained by calculation according to the first embodiment of the present invention.

FIG. 7 shows the results of simulating high-frequency characteristics when the thicknesses of the signal lead pin 132 and the ground lead pin 122 are 0.2 mm and 0.3 mm, respectively. An output signal and inter-channel crosstalk were calculated by inputting a high-frequency signal to the subassembly 50 in which a high-frequency IC was mounted on the high-frequency line structure 10 of this embodiment that has the signal lead pins 132 and ground lead pins 122 described above. Commercially available software "ANSYS HFSS" (Ansys) was used for the calculation.

The characteristics obtained by the calculation are those between the signal line ends of the coplanar lines provided on the printed board, and include the characteristics of the high-frequency IC mounted on the high-frequency line structure 10. The characteristics that rise to the right indicate the inter-channel crosstalk between adjacent channels. A dotted line graph 71 indicates inter-channel crosstalk when the signal lead pin and the ground lead pin have the same structure (a structure having a spring-up structure with a thickness of 0.2 mm), and a solid line graph 72 indicates inter-channel crosstalk in the present embodiment. A solid line graph 73 indicates band characteristics. It is indicated that the quality of high frequency signals is maintained up to 70 GHz. An improvement in crosstalk of about 20 dB was calculated over the entire frequency band, and the effectiveness of the present embodiment is confirmed. Accordingly, a high-frequency line structure 10 that has low crosstalk characteristic in a wide band is provided.

Second Embodiment

Figure 8:
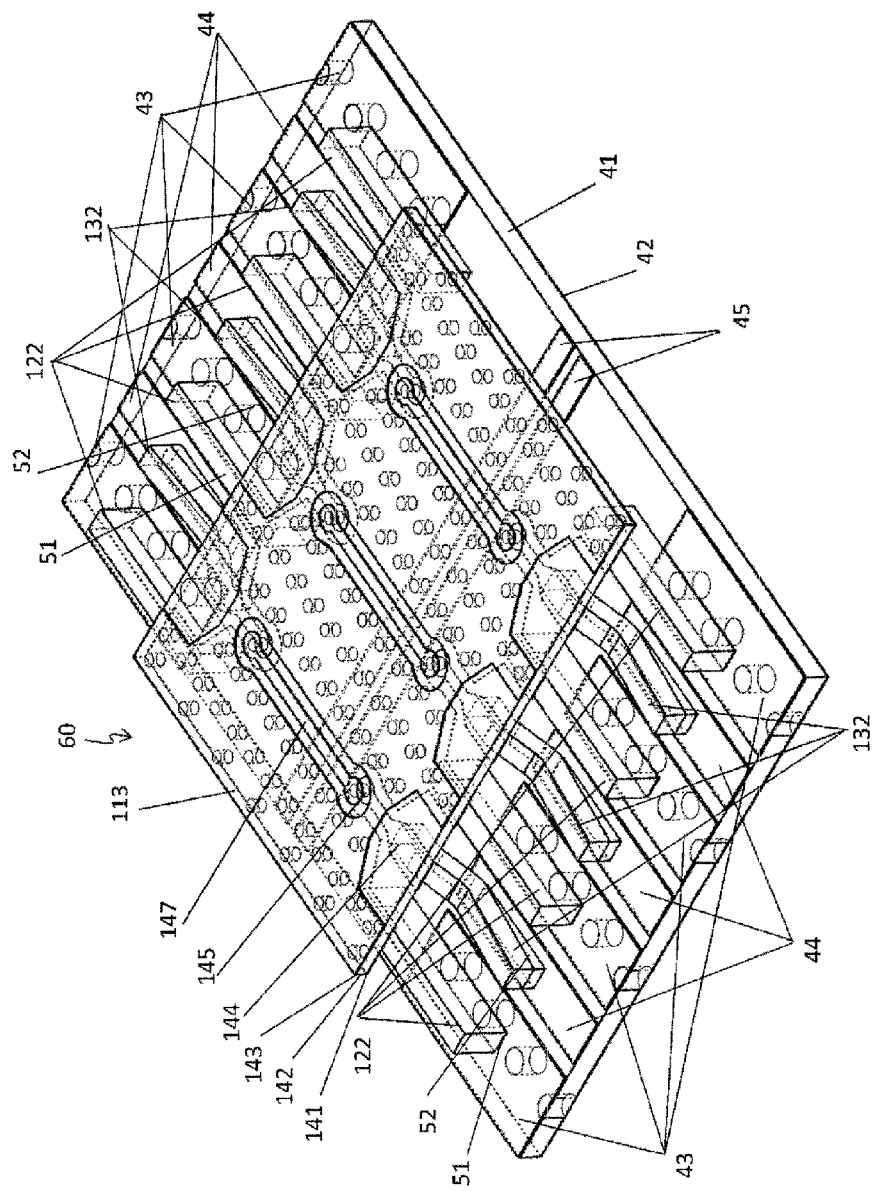
FIG. 8 is a bird's eye perspective view of a subassembly according to the second embodiment of the present invention.

Next, the second embodiment of the present invention will be described. FIG. 8 shows a subassembly 60 according to the second embodiment. The subassembly 60 is substantially the same as the subassembly 50 of the first embodiment, but is different in that high-frequency lines formed on a top surface of a high-frequency line substrate 113 include coplanar lines 147 that allow opposing connections at both ends of the substrate, and differential microstrip lines 45 are provided on the top surface of the printed board. This high-frequency line structure 10 realizes a three-dimensional high-frequency line structure without short-circuiting orthogonal high-frequency lines.

<Configuration of Subassembly>

Figure 9A:
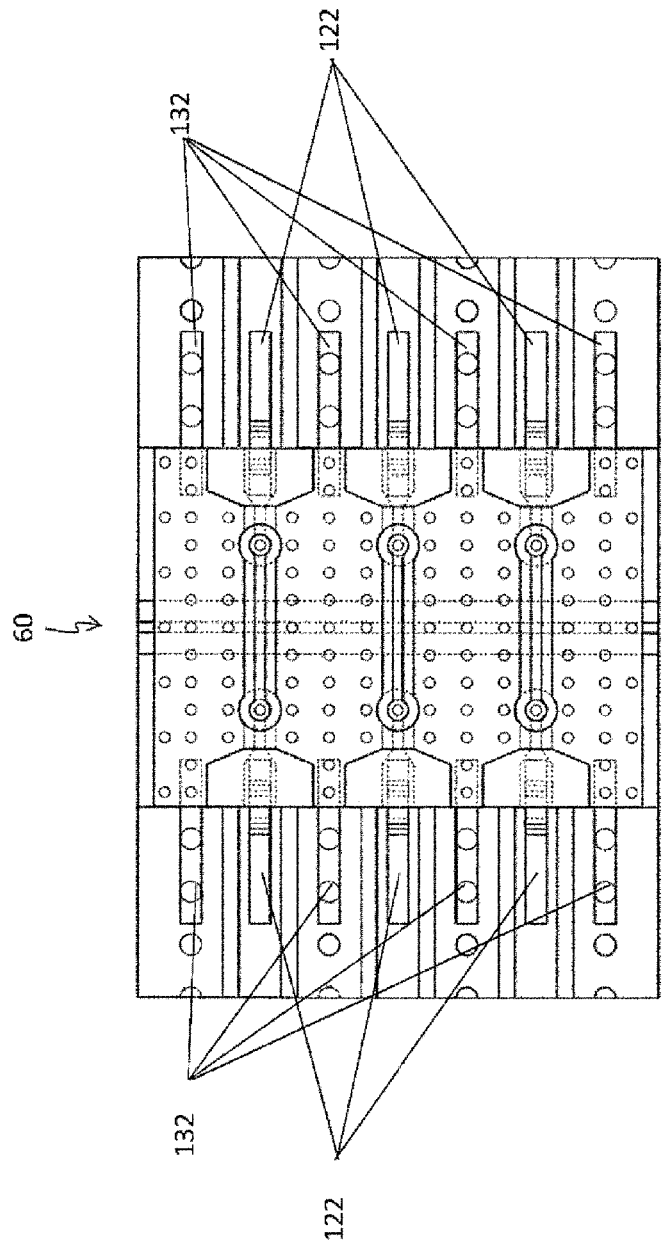
FIG. 9A is a top perspective view of the subassembly according to the second embodiment of the present invention.
Figure 9B:
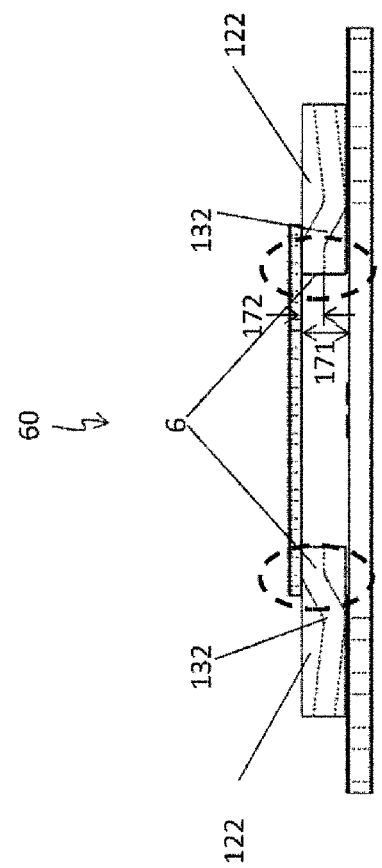
FIG. 9B is a side perspective view of the subassembly according to the second embodiment of the present invention.

FIG. 9A is a top perspective view of the subassembly 60, and FIG. 9B is a side perspective view. The signal lead pins 132 are arranged between the ground lead pins 122, and the signal lead pins 132 and the ground lead pins 122 have a structure characterized in that the thickness 171 of each ground lead pin 122 is larger than the thickness 172 of each signal lead pin 132 in the shielding regions 6 that are in contact with the high-frequency line substrate 113. Since air is present around the inclined structure of the signal lead pins, the signal lead pins in principle have a structure in which the electromagnetic field distribution can easily spread, causing the impedance in that area to become high impedance and degrading the reflection loss, while at the same time, crosstalk problems due to the large electromagnetic field distribution spread is likely to appear.

In the present embodiment, the ground lead pins 122 can not only suppress high impedance by due to an increase in the capacitance between the ground (earth) and the signal lead pins 132, but also suppress crosstalk between the signal lead pins 132 by functioning as shield plates for electromagnetic fields. For example, computational simulations confirmed that this configuration is especially effective when the thickness of each ground lead pin 122 is 1.5 times or more the thickness of each signal lead pin 132.

Meanwhile, the upper limit of the thickness of the ground lead pin 122 is determined by the balance between the effect of improving suppression of crosstalk suppression and the effect of reducing reflection loss. As mentioned above, as the thickness of the ground lead pin 122 increases, the function thereof as a shield plate is further improved and the effect of crosstalk suppression increases. Meanwhile, the increase in capacitance promotes lower impedance, and impedance mismatch occurs in the shielding regions 6 in FIG. 6B. Accordingly, it is desirable that the ground lead pin 122 has a thickness that can suppress crosstalk and also suppress impedance mismatch.

If the thickness of the thick lead frame 121, which corresponds to the thickness of the ground lead pin 122, becomes thicker than 0.5 mm, burrs may occur at the cutting portions after the cutting in the above-described manufacturing process, and subsequent electrical connection by means of solder or the like may become defective. For this reason, the upper limit of the thickness of the ground lead pin 122 is 0.5 mm.

Figure 10:
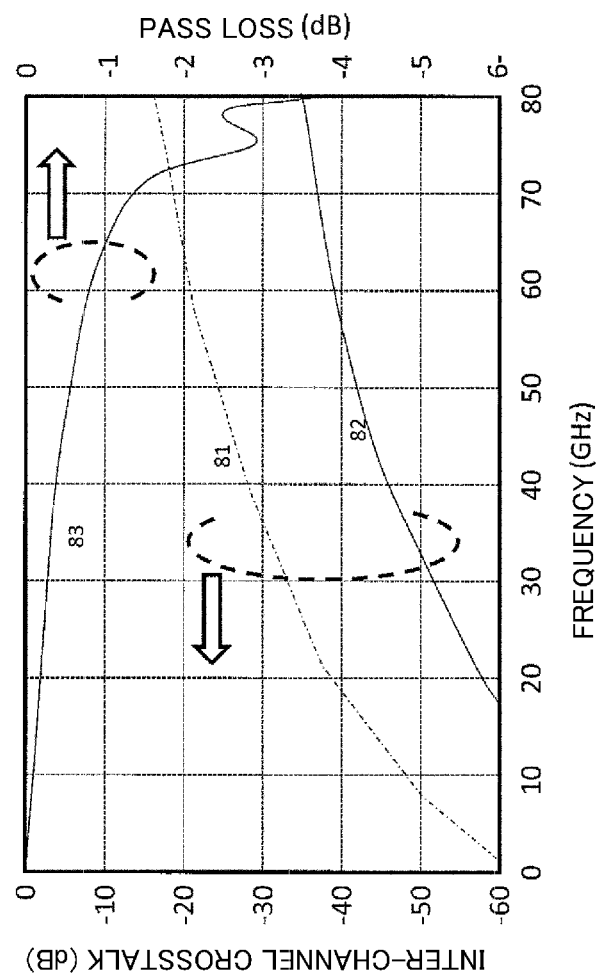
FIG. 10 shows calculation results of high-frequency characteristics of the subassembly that are obtained by calculation according to the second embodiment of the present invention.

FIG. 10 shows the results of simulating high-frequency characteristics when the thicknesses of the signal lead pin 132 and the ground lead pin 122 are 0.2 mm and 0.3 mm, respectively. An output signal and inter-channel crosstalk were calculated by inputting a high-frequency signal to the subassembly 60 in which a high-frequency IC was mounted on the high-frequency line structure 10 of this embodiment that has the signal lead pins 132 and ground lead pins 122 described above. Commercially available software "ANSYS HFSS" (Ansys) was used for the calculation.

The characteristics obtained by the calculation are those between the signal line ends of the coplanar lines provided on the printed board. The characteristics that rise to the right indicate the inter-channel crosstalk between adjacent channels. A dotted line trace 81 indicates inter-channel crosstalk when the signal lead pin and the ground lead pin have the same structure (a structure having a spring-up structure with a thickness of 0.2 mm), and a solid line graph 82 indicates inter-channel crosstalk in the present embodiment. A solid line 83 indicates band characteristics. It is indicated that the quality of high frequency signals is maintained up to 70 GHz. An improvement in crosstalk of about 20 dB was calculated over the entire frequency band, and the effectiveness of the present embodiment is confirmed. Accordingly, a high-frequency line structure 10 that has low crosstalk characteristic in a wide band is provided by providing the structure of the present embodiment.

Third Embodiment

Figure 11:
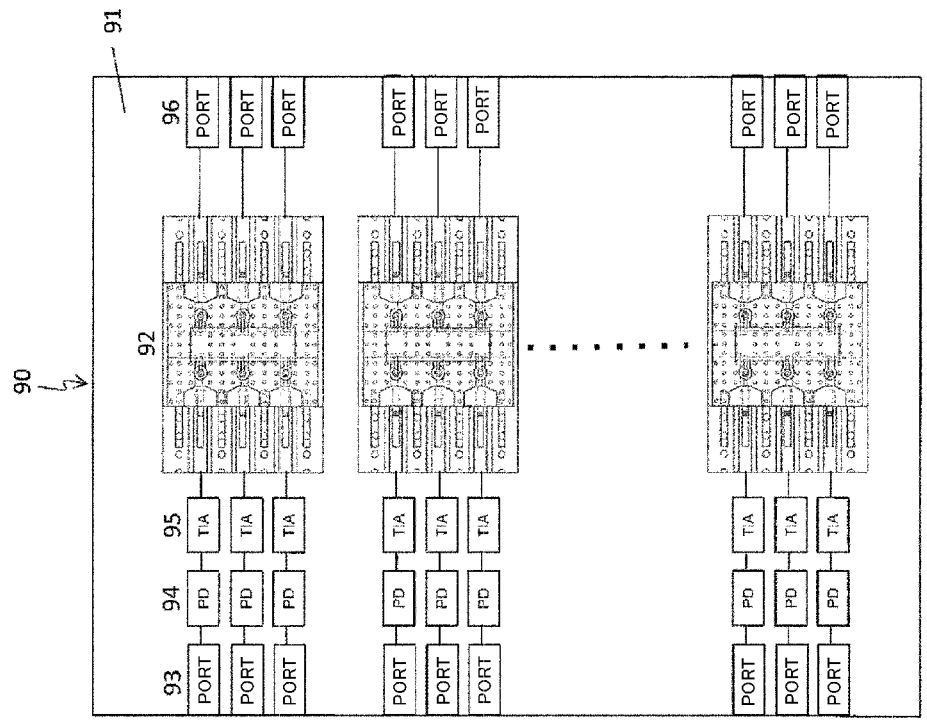
FIG. 11 is a conceptual diagram of a line card according to a third embodiment of the present invention.
Figure 12:
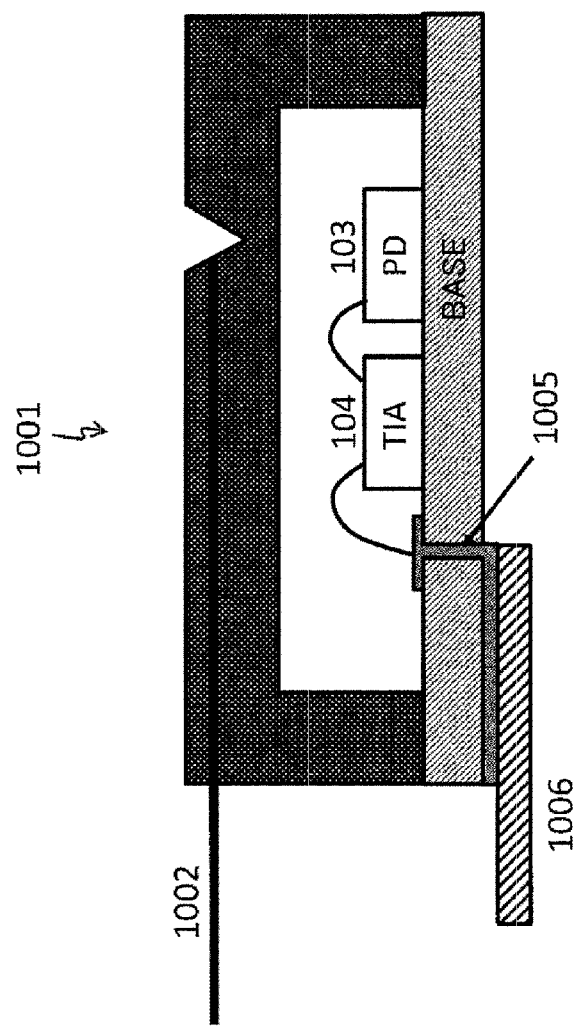
FIG. 12 is a conceptual diagram of an optical module of a conventional technology.

Next, the third embodiment of the present invention will be described.
<Configuration of Line Card>
FIG. 11 shows an example of a line card, which is the third embodiment of the present invention. Input ports 93, PDs 94, TIAs 95, and output ports 96 are mounted together with the subassemblies 92 of the first embodiment on a substrate 91. Optical fibers (not shown) are connected to the input ports, and high frequency optical signal are input thereto. The input optical signals are converted to high-frequency electrical signals via the PDs 94 and the TIAs 95, subjected to signal processing by the subassemblies 92, and are output from the output ports 96. The line card of the present embodiment enables high-frequency signal processing with low crosstalk characteristics in a wide band.

Although the subassembly of the first embodiment is used as the subassembly in the present embodiment, the subassembly of the second embodiment may alternatively be used, and any subassembly having the high-frequency line structure of embodiments of the present invention has the same effect.

The line card according to the present embodiment is for reception, but may alternatively be for transmission, and a laser diode (LD) and a light emitting diode (LED) may be mounted as optoelectronic devices.

In the first to third embodiments of the present invention, coplanar lines are used as the transmission lines in the high-frequency line substrates in and 113 and the printed board 41, but any other transmission lines such as microstrip lines may alternatively be used.

Although the dimensions of the constituent portions, components, and the like in the high-frequency line structure, the subassembly, the line card, and the method for manufacturing a high-frequency line structure according to the first to third embodiments of the present invention have been described, the dimensions are not limited thereto, and need only be dimensions with which the constituent portions, components, and the like function.

Although the dielectric material that constitutes the high-frequency line substrate is low-loss ceramic such as alumina in all the embodiments, it is needless to say that aluminum nitride, zirconia, cozilite, zircon, forsterite, quartz glass, or the like can be used instead. Further, in all the embodiments, gold plating for the purpose of improving wettability of solder is applied in general to each line connecting portion when the lead pins are electrically connected by means of solder. However, gold plating is not the essence of the present invention, and is therefore not specifically described.

INDUSTRIAL APPLICABILITY

Embodiments of the present invention can be applied to a high-frequency line structure, a subassembly, and a line card with excellent high-frequency characteristics, as well as an electronic component and an optical module component having wide-band characteristics for next-generation 1 Tbps and beyond.

REFERENCE SIGNS LIST

10 High-frequency line structure
111, 113 High-frequency line substrate
121 Thick lead frame
131 Thin lead frame
122 Ground lead pin
132 Signal lead pin
144 Bottom coplanar line end
146 Top coplanar line end
147 Coplanar line
15A, 15B Ridge portion
16 Flip-up amount
21 Positioning pressure jig
22 Base jig
32 CUTTING BLADE.

The invention claimed is:
1. A high-frequency line structure comprising:
a high-frequency line substrate;
ground lead pins, end portions of the ground lead pins being fixed to respective ground ends in a bottom surface of the high-frequency line substrate; and
signal lead pins, first end portions of the signal lead pins being fixed to respective signal line ends in the bottom surface of the high-frequency line substrate,
wherein each of the signal lead pins includes, in addition to the first end portion, a second end portion, and a ridge portion between the first end portion and the second end portion, and
wherein each of the signal lead pins has a structure in which the signal lead pin extends downward from the first end portion to the ridge portion, bends at the ridge portion, and extends upward from the ridge portion to the second end portion.
2. The high-frequency line structure according to claim 1, wherein each of the ground lead pins is thicker than each of the signal lead pins.
3. The high-frequency line structure according to claim 1, wherein a thickness of each of the ground lead pins is 1.5 times or more a thickness of each of the signal lead pins.
4. The high-frequency line structure according to claim 1, wherein a thickness of each of the ground lead pins is 0.5 mm or less.
5. The high-frequency line structure according to claim 1, wherein spring-up heights in the structure from which respective ones of the signal lead pins spring up are the same.
6. The high-frequency line structure according to claim 1, wherein the ridge portion is configured to protrude toward a direction away from the high-frequency line substrate, and extend in a direction perpendicular to a lengthwise direction of each of the signal lead pins.
7. A subassembly comprising:
the high-frequency line structure according to claim 1, wherein the signal lead pins are arranged between the ground lead pins; and
a printed board,
wherein a bottom surfaces of the ground lead pins are fixed to top surfaces of top ground ends of the printed board, and
wherein a bottom surface of the signal lead pins are fixed to signal line ends of the printed board.

8. A line card comprising a subassembly, the subassembly comprising:
    a high-frequency line structure comprising:
        a high-frequency line substrate;
        ground lead pins, end portions of the ground lead pins being fixed to respective ground ends in a bottom surface of the high-frequency line substrate; and
        signal lead pins, first end portions of the signal lead pins being fixed to respective signal line ends in the bottom surface of the high-frequency line substrate,
        wherein each of the signal lead pins includes, in addition to the first end portion, a second end portion, and a ridge portion between the first end portion and the second end portion, and
        wherein each of the signal lead pins has a structure in which the signal lead pin extends downward from the first end portion to the ridge portion, bends at the ridge portion, and extends upward from the ridge portion to the second end portion; and
    a printed board,
    wherein a bottom surface of the ground lead pins are fixed to top surfaces of top ground ends of the printed board, and
    wherein a bottom surface of the signal lead pins are fixed to signal line ends of the printed board.

9. A method for manufacturing a high-frequency line structure, the method comprising:
    providing a thick lead frame including a first plurality of lines, the first plurality of lines being arranged at an interval, base end portions of the first plurality of lines being integrally connected by a first joint portion and arranged in a comb shape;
    providing a thin lead frame including a second plurality of lines, the second plurality of lines being arranged at an interval, base end portions of the second plurality of lines being integrally connected by a second joint portion and arranged in a comb shape, each of the second plurality of lines having first end portions, ridge portions, and the base end portions in the lines, the ridge portions being between the first end portions and the base end portions, each of the second plurality of lines bends at the ridge portion;
    providing a high-frequency line substrate having a transmission line in a bottom surface thereof;
    mounting, on a base jig, the thick lead frame, the thin lead frame, and the high-frequency line substrate;
    arranging the second plurality of lines of the thin lead frame between the first plurality of lines of the thick lead frame above the base jig;
    arranging the ridge portions of the thin lead frame so as to come into contact with a top surface of the base jig;
    bringing ground ends in the bottom surface of the high-frequency line substrate and leading end portions of the first plurality of lines of the thick lead frame into contact with each other;
    bringing signal line ends in the bottom surface of the high-frequency line substrate and leading end portions of the second plurality of lines of the thin lead frame into contact with each other, each of the second plurality of lines of the thin lead frame extend downward from the leading end portion to the ridge portion, bends at the ridge portion, and extends upward from the ridge portion the base end portion;
    pressing a top surface of a positioning pressure jig placed on a top surface of the first joint portion of the thick lead frame and a top surface of the second joint portion of the thin lead frame, and a top surface of the high-frequency line substrate;
    fixing, using a conductive material, and electrically connecting portions at which the ground ends provided in the bottom surface of the high-frequency line substrate and the leading end portions of the first plurality of lines of the thick lead frame are brought into contact with each other, and portions at which the signal line ends provided in the bottom surface of the high-frequency line substrate and the leading end portions of the second plurality of lines of the thin lead frame are brought into contact with each other; and
    cutting the thick lead frame and the thin lead frame.

10. The method for manufacturing the high-frequency line structure according to claim 9,
    wherein a recessed portion to be fitted to the second joint portion of the thin lead frame and a protruding portion to be fitted to a space between the lines of the thick lead frame are provided in one surface of the positioning pressure jig.

* * * * *